(12) United States Patent
VanStee et al.

(10) Patent No.: US 8,015,426 B2
(45) Date of Patent: Sep. 6, 2011

(54) SYSTEM AND METHOD FOR PROVIDING VOLTAGE POWER GATING

(75) Inventors: Dustin J. VanStee, Poughkeepsie, NY (US); Thomas J. Griffin, Salt Point, NY (US); Leonard M. Greenberg, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 708 days.

(21) Appl. No.: 12/056,566

(22) Filed: Mar. 27, 2008

(65) Prior Publication Data
US 2009/0245008 A1 Oct. 1, 2009

(51) Int. Cl.
*G06F 1/32* (2006.01)
(52) U.S. Cl. ............ 713/324; 713/323; 365/229
(58) Field of Classification Search .......... 713/323, 713/324; 365/229
See application file for complete search history.

(56) References Cited

U.S. PATENT DOCUMENTS

| | | | |
|---|---|---|---|
| 5,513,135 A | 4/1996 | Dell et al. | |
| 6,381,685 B2 | 4/2002 | Dell et al. | |
| 6,434,076 B1 * | 8/2002 | Andersen et al. | 365/222 |
| 7,203,855 B2 * | 4/2007 | Chou | 713/320 |
| 7,581,124 B1 * | 8/2009 | Jacobson et al. | 713/310 |
| 2006/0128348 A1 * | 6/2006 | Jang | 455/343.1 |

* cited by examiner

*Primary Examiner* — Thuan N Du
(74) *Attorney, Agent, or Firm* — Cantor Colburn LLP

(57) ABSTRACT

A system and method for providing voltage power gating. The system includes a device for providing voltage power gating. The device includes logic circuitry, a mechanism for receiving a control signal associated with the logic circuitry and a selector. The control signal indicates an active state or an idle state of the logic circuitry. The selector enables a power source to the logic circuitry in response to the control signal indicating the active state. The selector also disables the power source to the logic circuitry in response to the control signal indicating the idle state. Thus, the power source is dynamically eliminated from the logic circuitry on the device when it is in the idle state.

17 Claims, 5 Drawing Sheets

SYSTEM AND METHOD FOR PROVIDING VOLTAGE POWER GATING

BACKGROUND OF THE INVENTION

This invention relates generally to computer memory, and more particularly to providing voltage power gating for memory interface devices using logical controls.

Contemporary high performance computing main memory systems are generally composed of one or more dynamic random access memory (DRAM) devices, which are connected to one or more processors via one or more memory control elements. Overall computer system performance is affected by each of the key elements of the computer structure, including the performance/structure of the processor(s), any memory cache(s), the input/output (I/O) subsystem(s), the efficiency of the memory control function(s), the main memory device(s), and the type and structure of the memory interconnect interface(s).

Extensive research and development efforts are invested by the industry, on an ongoing basis, to create improved and/or innovative solutions to maximizing overall system performance and density by improving the memory system/subsystem design and/or structure. High-availability systems present further challenges as related to overall system reliability due to customer expectations that new computer systems will markedly surpass existing systems in regard to mean-time-between-failure (MTBF), in addition to offering additional functions, increased performance, increased storage, lower operating costs, etc. Other frequent customer requirements further exacerbate the memory system design challenges, and include such items as ease of upgrade and reduced system environmental impact (such as space, power and cooling).

FIG. 1 depicts a contemporary system composed of an integrated processor chip 100, which contains one or more processor elements and an integrated memory controller 110. In the configuration depicted in FIG. 1, multiple independent cascade interconnected memory interface busses 106 are logically aggregated together to operate in unison to support a single independent access request at a higher bandwidth with data and error detection/correction information distributed or "striped" across the parallel busses and associated devices. The memory controller 110 attaches to four narrow/high speed point-to-point memory busses 106, with each bus 106 connecting one of the several unique memory controller interface channels to a cascade interconnect memory subsystem 103 (or memory module) which includes at least a hub device 104 and one or more memory devices 109. Some systems further enable operations when a subset of the memory busses 106 are populated with memory subsystems 103. In this case, the one or more populated memory busses 108 may operate in unison to support a single access request.

FIG. 2 depicts a memory structure with cascaded memory modules 103 and unidirectional busses 106. One of the functions provided by the hub devices 104 in the memory modules 103 in the cascade structure is a re-drive function to send signals on the unidirectional busses 106 to other memory modules 103 or to the memory controller 110. FIG. 2 includes the memory controller 110 and four memory modules 103, on each of two memory busses 106 (a downstream memory bus with 24 wires and an upstream memory bus with 25 wires), connected to the memory controller 110 in either a direct or cascaded manner. The memory module 103 next to the memory controller 110 is connected to the memory controller 110 in a direct manner. The other memory modules 103 are connected to the memory controller 110 in a cascaded manner. Although not shown in this figure, the memory controller 110 may be integrated in the processor 100 and may connect to more than one memory bus 106 as depicted in FIG. 1.

In current memory sub-systems, a main system limitation is the use of power by a memory interface device (MID) (e.g., a hub device 104) that resides on the dual in-line memory module (DIMM) or on a system motherboard. The power used can cause many different system design issues to occur such as thermal overheating of the system and large power supply current draws. These issues can be minimized by disabling logic during times when the logic is idle. Current draw via an application specific integrated circuit (ASIC) includes two components, alternating current (AC) and direct current (DC). Generally, designs target the elimination of AC power because logic can be implemented to minimize the AC power used during chip function. Methods of doing this usually entail the disabling of the clocks to the idle logic. This eliminates the power consumed by switching of the clocks and the switching of the gates in the idle logic. Other design practices include logic design that generates fewer logical switches per clock cycle. This type of design is difficult at times and can require large verification overhead to test effectiveness. Even with these design practices, leakage power is still not eliminated. It would be desirable to eliminate both the switching and leakage power associated with idle logic in order to reduce power usage.

BRIEF SUMMARY OF THE INVENTION

An exemplary embodiment includes a device for providing voltage power gating. The device includes logic circuitry, a mechanism for receiving a control signal associated with the logic circuitry and a selector. The control signal indicates an active state or an idle state of the logic circuitry. The selector enables a power source to the logic circuitry in response to the control signal indicating the active state. The selector also disables the power source to the logic circuitry in response to the control signal indicating the idle state. Thus, the power source is dynamically eliminated from the logic circuitry on the device when it is in the idle state.

Another exemplary embodiment includes a memory system. The memory system includes a memory controller for generating commands, a high speed bus in communication with the memory controller, and a MID cascade interconnected with the memory controller via the high speed bus and in communication with one or more memory devices. The MID includes logic circuitry for performing all or a subset of the commands, and a mechanism for receiving a control signal associated with the logic circuitry, the control signal indicating an active state or an idle state. The MID also includes a selector for enabling a power source to the logic circuitry in response to the control signal indicating the active state and for disabling the power source to the logic circuitry in response to the control signal indicating the idle state. Thus, the power source is dynamically eliminated from the logic circuitry on the MID when it is in the idle state.

A further exemplary embodiment includes a method for providing voltage power gating on a device. The method includes receiving a control signal associated with logic circuitry on a voltage island (VI) located on a device, the control signal indicating an active state. A power source is applied to the VI in response to the control signal. A fencing signal is removed to allow the VI to interface with device logic external to the VI. All or a portion of the logic circuitry located on the VI is executed. The fencing signal is enabled and the power source to the VI is disabled.

BRIEF DESCRIPTION OF THE DRAWINGS

Referring now to the drawings wherein like elements are numbered alike in the several FIGURES.

DETAILED DESCRIPTION OF EXEMPLARY EMBODIMENTS

Figure 1:
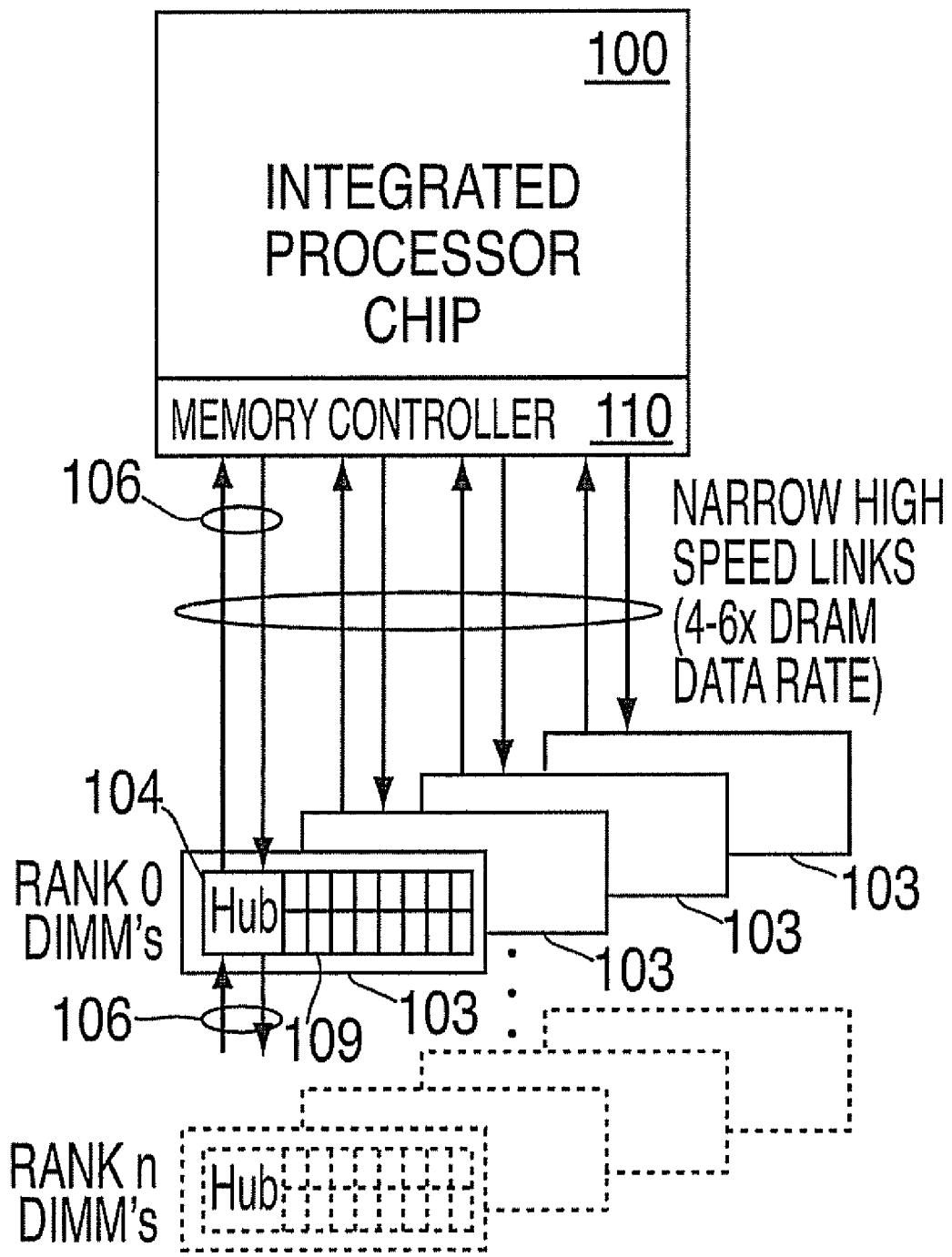
FIG. 1 depicts a cascade interconnect memory system with unidirectional busses.

An exemplary embodiment of the present invention includes a method to eliminate switching and leakage power by using a separate voltage island (VI) on a hub device for portions of logic that can be enabled and disabled during runtime, or system idle times. Different portions of functional logic are sectioned off onto VIs. When a function associated with the VI is not being used, the VI is disabled. In a memory interface device (MID), there are typically certain logic functions that are implemented only for test and debug, and are not needed during system mainline operation. As used herein, the term "system mainline operation" refers to a system in normal operation as opposed to a test and debug mode. In current designs, idle logic still consumes a significant amount of power due to the leakage of the devices. In an exemplary embodiment of the present invention that utilizes a VI, the logic is enabled and disabled by a control signal from the global chip logic. As used herein, the term "global chip logic" refers to high-level logic used to control other portions of an ASIC chip and is, itself, never shut off. This allows leakage current and AC switching associated with the disabled logic to be eliminated.

In a further exemplary embodiment, mainline memory interface chip logic is sequestered onto different VIs and is disabled during periods of memory sub-system idle time. In an exemplary embodiment, a memory controller is designed to forward dynamic chip power-on/power-off commands before active commands are sent to the dynamic random access memory (DRAM) devices. In this way, memory data pin logic which consumes a large amount of memory interface hub device power, can be disabled during idle times, and then enabled just before the commands are sent by the memory controller. The communication from the memory controller/processor to the hub device may be on a dedicated input/output (IO), or it may be encoded over a command protocol.

Certain uses of the VI are sensitive to the latency required to turn on the power. Functions that are to be executed dynamically need to guarantee VI logic operation is available in a timely manner to support these types of operations. The latency to power on the VI, the resetting of the VI, and the un-fencing of outputs are all considerations when determining the latency of a power-on operation. Chip functions that can be deterministically predicted or that have an inherent latency are the best functions to implement as dynamic enable and dynamic disable functions in a VI. Examples of these types of functions include, but are not limited to, functions that turn on based on a timer on a known interval, and read data return functions that have the inherent read latency in a memory sub-system. As power-gating technology improves, the time required to enable and disable voltage island functions improves, thereby allowing greater application of voltage gating to latency-sensitive logic inside the chip.

As used herein, the term "voltage island" or "VI" refers to a separate partition for logic that has its own power domain. As used herein, the term "power-off mode" refers to a mode in which the VI logic is idle, or turned off, and the power source to the VI is disabled (e.g., prevented from reaching the VI). As used herein, the term "power-on mode" refers to a mode in which the VI logic is active, or turned on, and the power source to the VI is enabled (e.g., applied to the VI). The power-on-mode may also specify a voltage level, thereby allowing the voltage to be throttled, or lowered, which may be utilized to contribute to a power savings. As used herein, the term "fence" refers to a method of maintaining stable signal states during times when a voltage domain is powered on and off.

Figure 3:
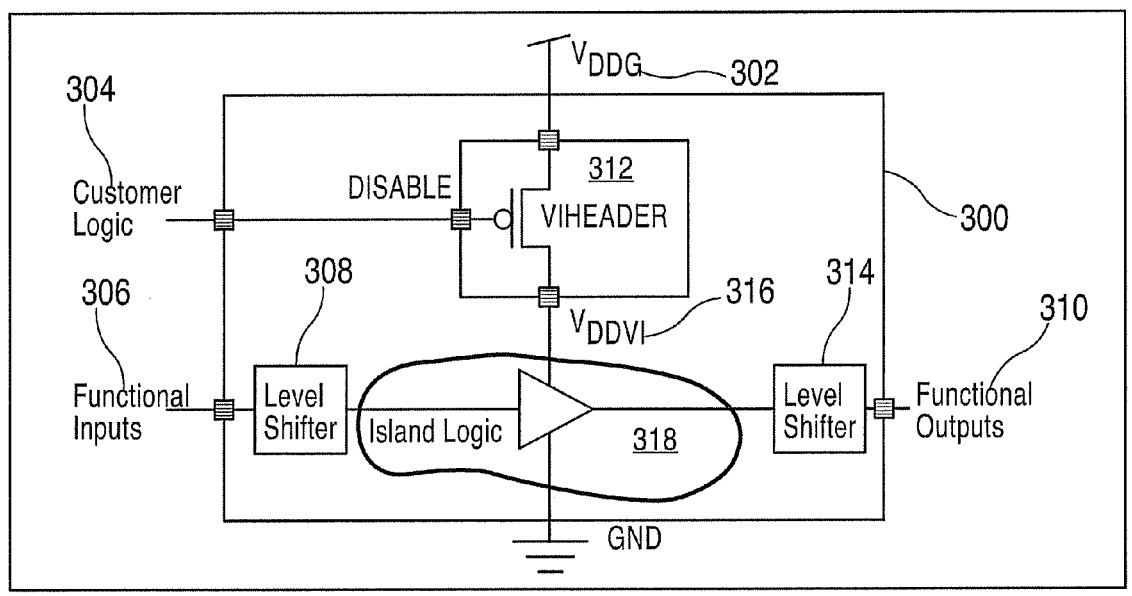
FIG. 3 is a block diagram of a voltage island that may be implemented by an exemplary embodiment.

FIG. 3 is a block diagram of general inputs and components of a VI block 300 that may be implemented by an exemplary embodiment. In an exemplary embodiment, such as one described herein, the VI block 300 is located on a MID. In alternate exemplary embodiments, the VI block 300 is located on any device that is used multiple times within a system. The VI block 300 includes a global chip voltage source 302 (VDDG) that powers the MID where the VI block 300 is located. A VI enable circuit 312 (VIHEADER) (also referred to herein as a selector) takes an enable/disable input from the global chip logic, or customer logic 304, which allows the VDDG 302 to be connected to the VI voltage domain 316 (VDDVI) through a transistor. In this manner, the VI power state is controlled from an internal chip logical function. In an exemplary embodiment, the enable input specifies a voltage level to allow throttling of the voltage being supplied to the VI block 300. Functional inputs 306 are used to interface with the VI logic 318 through a voltage level shifter 308 which converts functional input voltage levels into internal VI levels. A voltage level shifter 314 then converts the internal VI levels into functional output levels. The VI logic 318 performs a chip function in the VDDVI voltage domain, and the functional outputs 310 interface with a different VI and/or the global chip logic.

The block diagram depicted in FIG. 3 is a beneficial VI implementation because internal chip logic can be synchronized to control power-on, power-off, reset, and fencing of the VI, and because it does not require the use of extra IO's on MIDs (which are already I/O bound). This implementation forces the VDDVI 316 to be the same value as VDDG 302. In an alternate exemplary embodiment, a MID input is utilized as the voltage source, and each source is isolated from the other VI sources during the physical design of the memory hub device. In this alternate exemplary embodiment, an external control signal is required to power on the VI and an input is also required to properly fence the VI until stable power is achieved.

Figure 2:
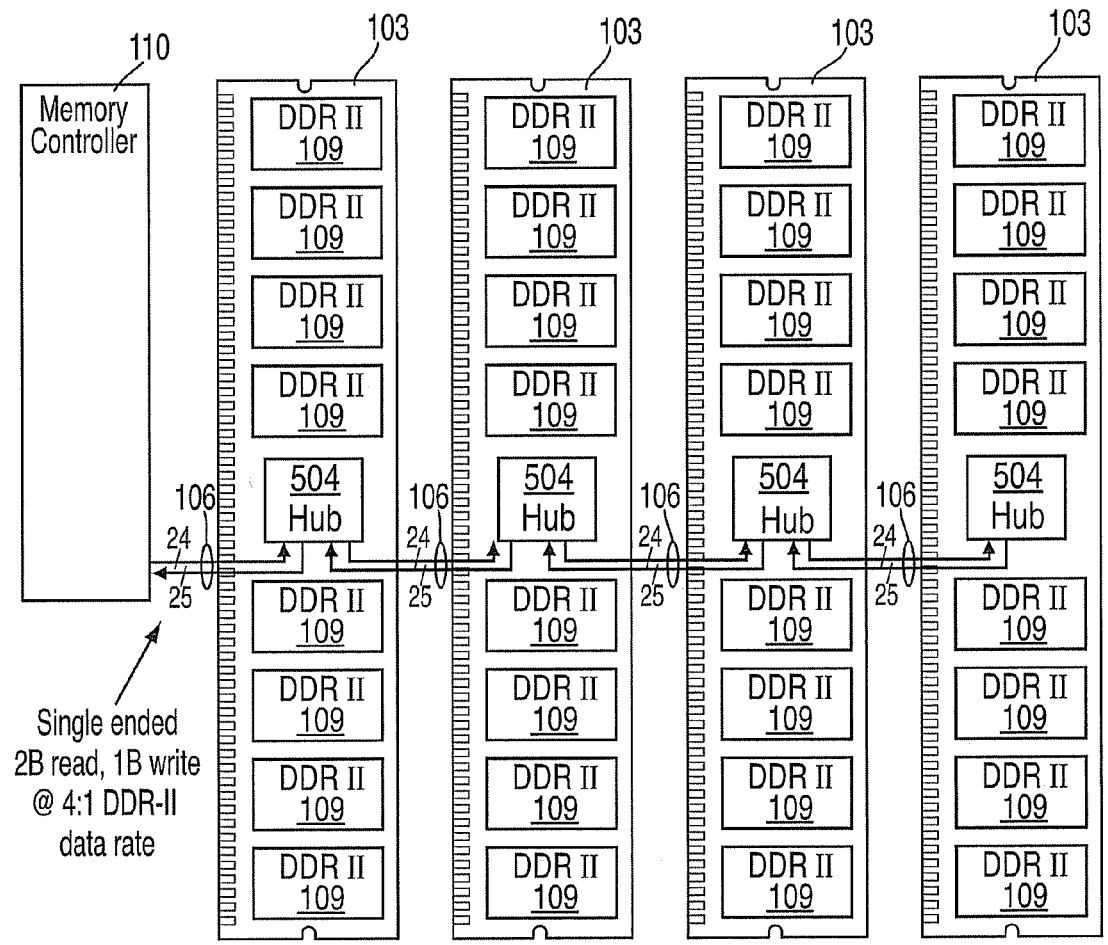
FIG. 2 depicts a cascade interconnect memory system with unidirectional busses.
Figure 4:
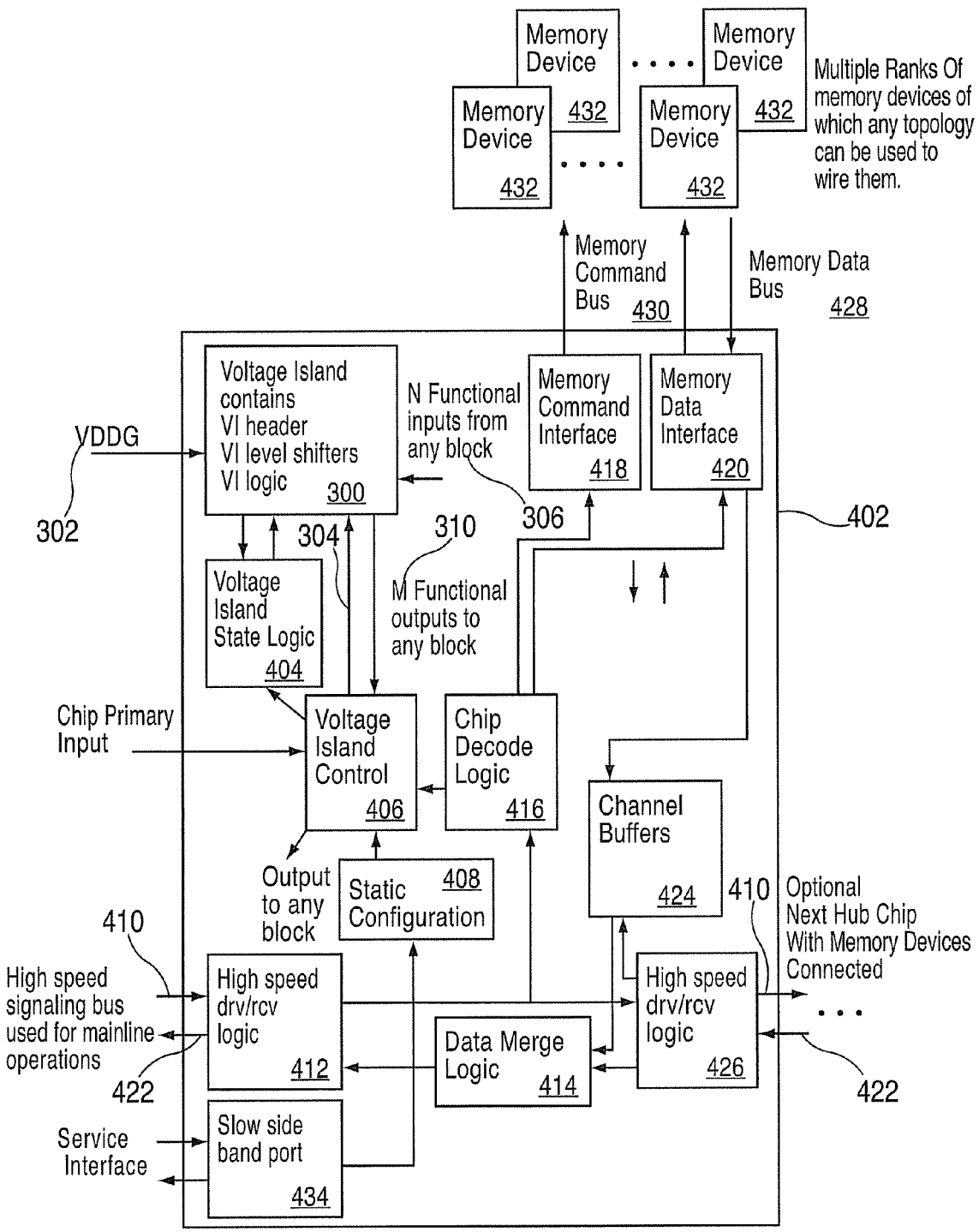
FIG. 4 is a block diagram of a hub chip that may be implemented by an exemplary embodiment.

FIG. 4 is a high-level block diagram of a MID 402 (e.g., hub chip or hub device 104) with a VI block 300 that may be implemented by an exemplary embodiment. In an exemplary embodiment, the memory system containing the MID 402 is configured in a manner similar to the cascade interconnect memory systems depicted in FIGS. 1 and 2, although other interconnect structures such as multi-drop, etc, may also be used. The blocks in the lower left and right portions of FIG. 4 (412, 426) are associated with receiving or driving a high-speed bus (made up of one or more upstream bus(ses) 422 and downstream bus(ses) 410). The upstream bus 422 passes information in the direction of a memory controller or processor, and the downstream bus 410 passes information away from the memory controller or processor.

Referring to FIG. 4, data, command, address, ECC, and clock signals from an upstream memory assembly (e.g., a memory module or a memory controller) are received via the downstream memory bus 410 into high-speed driver/receiver logic 412. FIG. 4 also includes a separate service interface 434 for receiving signals into the MID 402. As used herein, the term "logic" refers to hardware circuitry and/or software instructions for performing one or more functions. The receiver logic in the high-speed driver/receiver logic 412 provides macros and support logic for the downstream memory bus 410 and, in an exemplary embodiment of the present invention, includes support for a twenty-two bit, high speed, slave receiver bus. The received signals (which may be changed/reordered in response to ECC/sparing functions) are input to high-speed driver/receiver logic 426 for transmission, via the downstream memory bus 410, to the next memory module in the chain. The high-speed driver/receiver logic 426 provides macros and support logic for the downstream memory bus 410 and in an exemplary embodiment, the twenty-two bit, high-speed, low-latency cascade bus drivers.

In addition to being transferred to the high-speed driver/receiver logic 426, the received signals are also transferred to chip decode logic 416. The chip decode logic 416 determines if the received signals (including data, command and address signals) are directed to and should be processed by the memory module associated with the hub device receiving the received signals. If the received signals are directed to the memory module, then the chip decode logic 416 determines what actions to take and may initiate DRAM actions, write buffer actions, read buffer actions or a combination thereof. Depending on the type of memory module (buffered, unbuffered, registered), the chip decode logic 416 selects the appropriate drive characteristics, timings and timing relationships. The data signals are transmitted to a memory data interface 420 and the associated addresses and command signals are transmitted to a memory command interface 418, consistent with the specification for the memory module type (buffered, unbuffered, registered, etc.).

The memory command interface 418 includes programmable timing circuitry to enable memory device timings to be met whether the devices are directly attached to the hub, or attached indirectly via one or more modules connected to the hub/adapter assembly. Unbuffered memory modules, which do not include re-drive or address, control and/or command data, will generally be operated with timings similar to those of direct-attached memory devices; however drive strengths on the memory command interface 418 may be adjusted, as well as timing relationships between signals and/or signal groupings, based on the unbuffered module type (e.g. whether the Unbuffered DIMM is a conventional Unbuffered DIMM (e.g. a UDIMM), an SO DIMM (small outline DIMM), or other Unbuffered DIMM type, the memory device count, DIMM wiring topology, etc). Registered memory modules generally include re-drive of one or more of address, control and command signals, thereby generally requiring a lower drive strength from the memory command interface 418, but may require a shift in one or more of the address, control and command timings relative to data due to the re-drive delay on these one or more signals on the registered DIMM.

The memory command interface 418, therefore, includes one or more of additional programmable drive strength, terminations, programmable timings (signal output times relative to clock) and clock relationships (e.g. signals may be sent on different clock boundaries) such that a wide range of memory device attachment methods (directly and indirectly attached to the command interface) can be supported. The memory clocks are also forwarded to the attached memory devices and/or modules via clock pairs (e.g., 6 differential clock pairs or 12 wires) from the memory command interface 418. The memory commands are transmitted to the memory device(s) 432 via a command memory bus 430, which may also include the memory clocks, or these clocks may be sent via a separate bus structure (not shown).

Similarly, the memory data interface 420 reads from and writes memory data, via one or more memory data bus(es) 428, to directly attached memory device(s) 432 and/or to one or more memory modules (not shown in FIG. 4). As with the memory command interface 418, the memory data interface 420 includes one or more of programmable drive strength, terminations, programmable timings (signal output times relative to clock) and clock relationships (signals may be sent on different clock boundaries, relative to the clocks sourced from memory command interface 418) such that a wide range of memory device attachment methods (directly and indirectly attached to the command interface) can be supported. With the exemplary interface programmability included in the memory data interface 420 and memory command interface 418, the exemplary MID 402 (e.g., a hub device) offers a single device and/or package solution which can be used on a module as part of a memory subsystem, on an adapter card to connect to one or more attached memory modules, as an interface device (on a system board or card) to adapt a packetized, multi-transfer interface to an alternate parallel interface, such as a multi-drop, fly-by or other memory interface, etc.

Data signals to be transmitted to the memory controller may be temporarily stored in the channel buffers 424 after a command, such as a read command, has been executed by the memory module, consistent with the memory device 'read' timings. The channel buffers 424 transfer the read data into data merge logic 414 which merges the data on to the upstream memory bus 410 via the high-speed driver/receiver logic 412. The high-speed driver/receiver logic 412 transmits the signals (which may be changed/reordered in response to ECC/sparing functions during normal operation), via the upstream memory bus 422, to the next memory assembly (i.e., memory module) or memory controller in the chain. The high-speed driver/receiver logic 412 provides macros and support logic for the upstream memory bus 422 and, in an exemplary embodiment of the present invention, includes support for a twenty-three bit, high speed, low latency cascade driver bus.

Data, clock and ECC signals from the upstream memory bus 422 are also received by any upstream MID (e.g., a hub device) in any upstream memory module. These signals need to be passed upstream to the next memory module or to the memory controller. Referring to FIG. 4, data, ECC and clock signals from a downstream memory assembly (i.e., a memory module) are received on the upstream memory bus 422 into the high-speed driver/receiver logic 426. The high-speed driver/receiver logic 426 provides macros and support logic for the upstream memory bus 422 and, in an exemplary embodiment of the present invention includes support for a twenty-three bit, high speed, slave receiver bus. The receiver in the high-speed driver/receiver logic 426 passes the data and ECC signals, through the data merge logic 414. The signals are transmitted to the upstream memory bus 422 via the high-speed driver/receiver logic 412.

The VI block 300 depicted in FIG. 4 includes "N" functional inputs 306 and "M" functional outputs 310. The functional inputs 306 include any combination of different clock and data signals. The clocks can be derived off of a chip phase locked loop (PLL) located on the MID 402 or off of the main input bus clock (e.g., received via the downstream bus 416) depending upon the application. Any number of chip functions that chop and divide clocks can also be applied to the input clocks prior to sending the signal to the VI block 300. Data signals are generated from other voltage islands and/or global chip logic and sent to the VI block 300.

The VI control block 406 is used to enable and disable the VI block 300, and also to condition outputs to ensure correct output states during times when the VI block 300 is not in operation (e.g., when idle). The VI control block 406 can generate a control signal to enable and disable the VI block 300 from a primary input, a chip configuration register 408, a command from the high speed bus (e.g., via a command stream) decoded at the chip decode logic block 416, or via an internal piece of control logic that would dynamically enable the VI block 300. In addition, the control signal may specify a throttled voltage level applied to VI block 300 via VDDG input 302. In an alternate exemplary embodiment, fencing logic is implemented in the VI control block 406 to control the output state of the VI functional outputs 310. An alternate embodiment includes fencing VI block 300 block functional outputs 310 using a signal that connects to the VI level shifters 314 depicted in FIG. 3. Once the VI block 300 is powered on, the fence gating the functional output signals can be removed so that the VI block can interface with the main chip logic.

In an alternate exemplary embodiment, a VI state logic (VISL) block 404 is utilized. The VISL block 404 is used when a certain subset of control latches are needed to preserve the previous state of the VI block 300 such that the next use of the VI logic 318 can start from a previously recorded state, or to preload a specified state into the VI block 300. An example of where the previously recorded state function is useful is in dynamically enabling and disabling the VI block 300. For instance, performance counters used to count commands entering the MID 402 can be enabled during the arrival of commands, such that the counter logic can count, and then return to power-off mode (e.g., disable the power source to the VI block 300). Queue logic is used to store incoming commands until the VI block 300 is powered on to a stable state. The count itself needs to be maintained, while the logic needed to generate values is powered off during idle times. Therefore, the count is saved during the save state time. An example of the use of the preload function is the setting of a finite state machine (FSM) into a state that is difficult to enter, or that takes a long time to enter, or the loading of the reset state for the critical latches in the VI block 300.

For simplicity and ease of description, the MID 402 depicted in FIG. 4 is not intended to depict every logic element that would be included in the MID 402. Other elements not depicted may be included such as, but not limited to, ECC logic and sparing logic.

The block diagram in FIG. 4 is one implementation of a MID 402 that may be utilized by exemplary embodiments of the present invention. Other implementations are possible without departing from the scope of the present invention. As used herein, the terms "high speed link", "high speed interface" and "high speed bus" are used interchangeably, and may refer to what may be construed as one or more busses in alternate exemplary embodiments.

Figure 5:
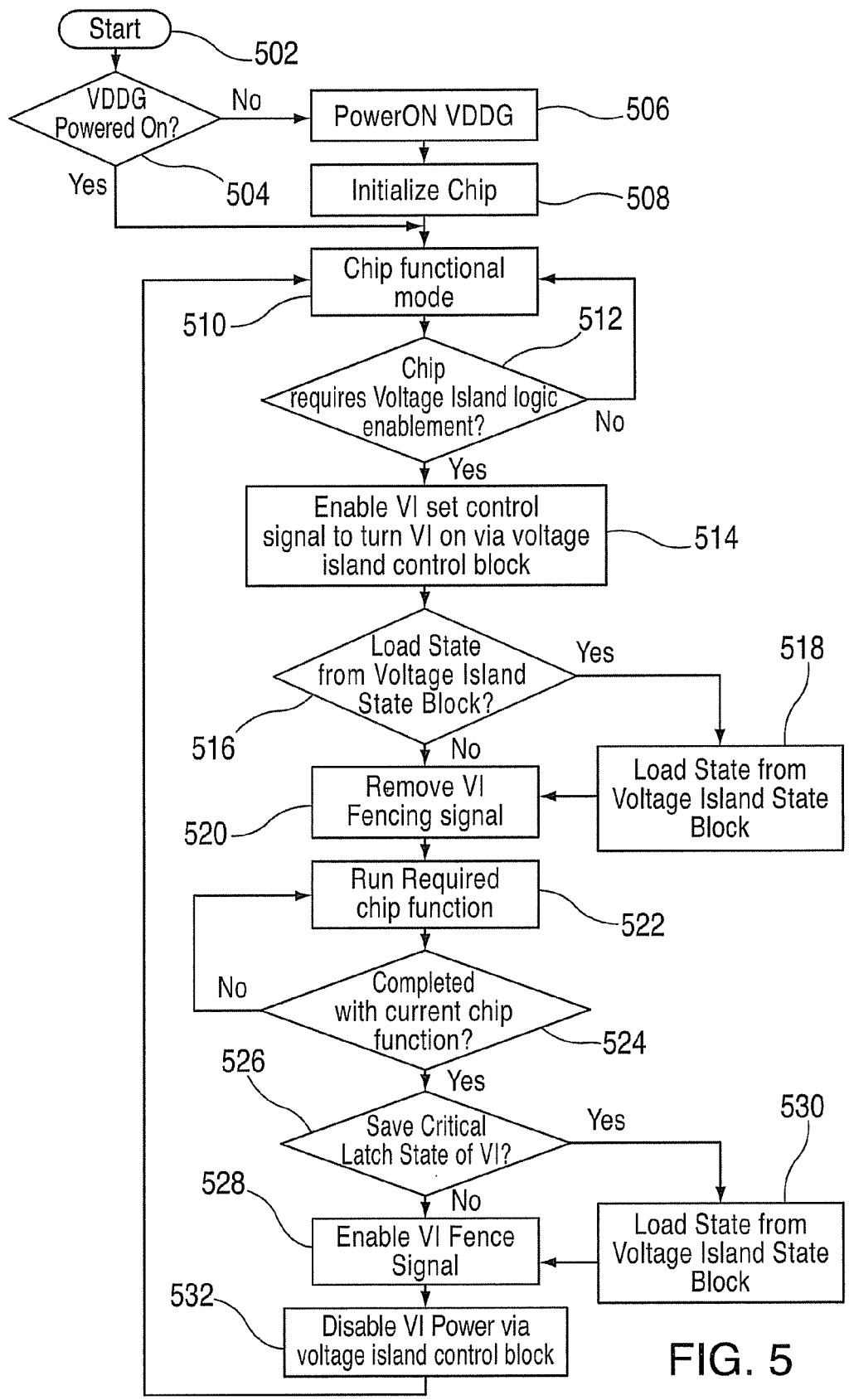
FIG. 5 is a diagram of a process flow that may be implemented by an exemplary embodiment.

FIG. 5 is a diagram of a process flow that may be implemented by an exemplary embodiment. The process starts at block 502 with the system being in any state. At block 504 it is determined if the MID has power enabled. If the power is not enabled, then block 506 is performed to enable the power source (e.g., VDDG 302) and at block 508, the MID is initialized 508. Blocks 506 and 508 include all the required operations (the details are not all described herein) required to put the MID into a functional mode, such that runtime commands can be executed. Static chip configuration load, PLL locking, clock enablement, are examples of operations performed during this time.

Processing continues at block 510 where the MID is in a functional state. This means that it is in an idle state awaiting a MID command that can be sent via a high speed command stream via the a high speed bus or via a configuration register write operation using the service interface. The MID could also be in a runtime, or active, state and a dynamic VI enable signal is generated based on the knowledge that some MID logic will be required for use within the VI power up time. A test to check if a VI block is required is conducted at block 512. If the VI block is not required, then processing returns to block 510. If the VI block is required, then processing continues at block 514 where the VI block is enabled by driving a control signal into the VI block that controls the enablement of VDDVI. At block 514, a control signal indicating an active state is driven into the VI block. This causes the power source to the logic circuitry in the VI to be enabled. Before performing any operations in the VI block, the VI power up time must be satisfied. Power up time will be a function of voltage island size and technology characteristics.

Next, block 516 is performed to determine if a load of a previous state is required. This requirement for a load of a forced state is controlled by external chip logic, and is a dependent on the needs of the application. The signal is generated from the VI control block. If it is determined at block 516 that a previous load state is not required, then processing continues at block 520. Alternatively, if it is determined at block 516 that a previous load state is required, then block 518 is performed to load the state from the VI state block. Processing then continues at block 520. At block 520, the fences that condition the VI outputs are removed to allow the VI to interface with the MID logic. This allows for a deterministic behavior of the VI outputs while the VI is powering on to a good state.

Processing continues at block 522 where the MID function that resides in the VI block is executed. At this time, the VI logic can communicate with global chip logic, or logic in other VI blocks. If the VI logic will be enabled until it is no longer required. This is determined by many possible operations. The done signal can be generated via internal logic, configuration write commands, a primary input change, or via a high speed command decode. Once VI done signal is received 524, the next step is to determine if a save of critical latch state is necessary 526. This will be determined by the MID application using the VI block, and signaling will be generated from the VI control block to enable this function at block 530. Flow then proceeds to block 528. If it is determined at block 526 that no state needs to be saved, then flow proceeds to block 528. The fences to condition the output signals are enabled at this time at block 530. This controls the outputs such that no spurious commands are sent to logic that interfaces with the VI block. After the VI functions are performed, the VI block is shut off at block 532 to eliminate leakage current and to conserve power. Upon completion of this step, processing returns to block 510 and awaits further VI enable commands.

FIG. 5 depicts an exemplary embodiment of voltage island flow control that is advantageous for applications that require low latency because there is only a deterministic wait time involved before executing a command. An alternate exemplary embodiment includes the use of a handshake protocol.

For example, after the deterministic wait time, a command that requires an acknowledgement is sent to the VI block. The acknowledgement could be a transition of a single output or a more complicated response of multiple signals over multiple cycles. Once positive acknowledgement is received, the VI logic is used for the required function. If an acknowledgement is not received within a predetermined time period (i.e., an error is detected) the VI block is powered off, and a retry is commenced. If upon the second attempt to power-on the VI block a positive acknowledge is not detected, an error bit is set to inform the user that the VI block did not power on correctly. This process requires extra time overhead in terms of time to enable a voltage island function, but it is more reliable based on the handshaking protocol required. This type of checking is best suited for VI applications that can tolerate the extra overhead in initial power on latency.

FIG. 5 depicts the use of a single VI block, however a multiplicity of VI blocks and the controls that govern their operation can also be implemented by an exemplary embodiment. In an exemplary embodiment, each VI block and its associated controls are executed as a separate instantiation of this concept.

The exemplary embodiments described herein use a voltage island as an example of how to group logic circuitry for power control purposes. Exemplary embodiments may also be implemented by utilizing a voltage regulated supply (that can disabled and enabled to one or more specified voltage levels) to power all or a subset of the circuits on a memory interface device. The voltage regulated supply may be sourced from an independent voltage rail that is driven off of the main voltage rail for the memory interface device (or memory module). Thus, the voltage level may be throttled based on application requirements to provide additional power savings.

In an exemplary embodiment, hub devices may be connected to the memory controller through a multi-drop or point-to-point bus structure (which may further include a cascade connection to one or more additional hub devices). Memory access requests are transmitted by the memory controller through the bus structure (e.g., the memory bus) to the selected hub(s). In response to receiving the memory access requests, the hub device translates the memory access requests to control the memory devices to store write data from the hub device or to provide read data to the hub device. Read data is encoded into one or more communication packet(s) and transmitted through the memory bus(ses) to the memory controller.

In alternate exemplary embodiments, the memory controller(s) may be integrated together with one or more processor chips and supporting logic, packaged in a discrete chip (commonly called a "northbridge" chip), included in a multi-chip carrier with the one or more processors and/or supporting logic, or packaged in various alternative forms that best match the application/environment. Any of these solutions may or may not employ one or more narrow/high speed links to connect to one or more hub chips and/or memory devices.

The memory modules may be implemented by a variety of technology including a DIMM, a single in-line memory module (SIMM) and/or other memory module or card structures. In general, a DIMM refers to a small circuit board which is comprised primarily of random access memory (RAM) integrated circuits or die on one or both sides with signal and/or power pins on both sides of the board. This can be contrasted to a SIMM which is a small circuit board or substrate composed primarily of RAM integrated circuits or die on one or both sides and single row of pins along one long edge. The DIMM depicted in FIG. 1 includes 168 pins in the exemplary embodiment, whereas subsequent DIMMs have been constructed with pincounts ranging from 100 pins to over 300 pins. In exemplary embodiments described herein, memory modules may include two or more hub devices.

In exemplary embodiments, the memory bus is constructed using multi-drop connections to hub devices on the memory modules and/or using point-to-point connections. The downstream portion of the controller interface (or memory bus), referred to as the downstream bus, may include command, address, data and other operational, initialization or status information being sent to the hub devices on the memory modules. Each hub device may simply forward the information to the subsequent hub device(s) via bypass circuitry; receive, interpret and re-drive the information if it is determined to be targeting a downstream hub device; re-drive some or all of the information without first interpreting the information to determine the intended recipient; or perform a subset or combination of these options.

The upstream portion of the memory bus, referred to as the upstream bus, returns requested read data and/or error, status or other operational information, and this information may be forwarded to the subsequent hub devices via bypass circuitry; be received, interpreted and re-driven if it is determined to be targeting an upstream hub device and/or memory controller in the processor complex; be re-driven in part or in total without first interpreting the information to determine the intended recipient; or perform a subset or combination of these options.

In alternate exemplary embodiments, the point-to-point bus includes a switch or bypass mechanism which results in the bus information being directed to one of two or more possible hub devices during downstream communication (communication passing from the memory controller to a hub device on a memory module), as well as directing upstream information (communication from a hub device on a memory module to the memory controller), often by way of one or more upstream hub devices. Further embodiments include the use of continuity modules, such as those recognized in the art, which, for example, can be placed between the memory controller and a first populated hub device (i.e., a hub device that is in communication with one or more memory devices), in a cascade interconnect memory system, such that any intermediate hub device positions between the memory controller and the first populated hub device include a means by which information passing between the memory controller and the first populated hub device can be received even if the one or more intermediate hub device position(s) do not include a hub device. The continuity module(s) may be installed in any module position(s), subject to any bus restrictions, including the first position (closest to the main memory controller, the last position (prior to any included termination) or any intermediate position(s). The use of continuity modules may be especially beneficial in a multi-module cascade interconnect bus structure, where an intermediate hub device on a memory module is removed and replaced by a continuity module, such that the system continues to operate after the removal of the intermediate hub device. In more common embodiments, the continuity module(s) would include either interconnect wires to transfer all required signals from the input(s) to the corresponding output(s), or be re-driven through a repeater device. The continuity module(s) might further include a non-volatile storage device (such as an EEPROM), but would not include main memory storage devices.

In exemplary embodiments, the memory system includes one or more hub devices on one or more memory modules connected to the memory controller via a cascade interconnect memory bus, however other memory structures may be implemented such as a point-to-point bus, a multi-drop memory bus or a shared bus. Depending on the signaling methods used, the target operating frequencies, space, power, cost, and other constraints, various alternate bus structures may be considered. A point-to-point bus may provide the optimal performance in systems produced with electrical interconnections, due to the reduced signal degradation that may occur as compared to bus structures having branched signal lines, switch devices, or stubs. However, when used in systems requiring communication with multiple devices or subsystems, this method will often result in significant added component cost and increased system power, and may reduce the potential memory density due to the need for intermediate buffering and/or re-drive.

The memory modules or hub devices may also include a separate bus, such as a 'presence detect' bus, an I2C bus and/or an SMBus which is used for one or more purposes including the determination of the hub device an/or memory module attributes (generally after power-up), the reporting of fault or status information to the system, the configuration of the hub device(s) and/or memory subsystem(s) after power-up or during normal operation or other purposes. Depending on the bus characteristics, this bus might also provide a means by which the valid completion of operations could be reported by the hub devices and/or memory module(s) to the memory controller(s), or the identification of failures occurring during the execution of the main memory controller requests.

Performances similar to those obtained from point-to-point bus structures can be obtained by adding switch devices. These and other solutions offer increased memory packaging density at lower power, while retaining many of the characteristics of a point-to-point bus. Multi-drop busses provide an alternate solution, albeit often limited to a lower operating frequency, but at a cost/performance point that may be advantageous for many applications. Optical bus solutions permit significantly increased frequency and bandwidth potential, either in point-to-point or multi-drop applications, but may incur cost and space impacts.

As used herein the term "buffer" or "buffer device" refers to a temporary storage unit (as in a computer), especially one that accepts information at one rate and delivers it another. In exemplary embodiments, a buffer is an electronic device that provides compatibility between two signals (e.g., changing voltage levels or current capability). The term "hub" is sometimes used interchangeably with the term "buffer." A hub is a device containing multiple ports that is connected to several other devices. A port is a portion of an interface that serves a congruent I/O functionality (e.g., a port may be utilized for sending and receiving data, address, and control information over one of the point-to-point links, or busses). A hub may be a central device that connects several systems, subsystems, or networks together. A passive hub may simply forward messages, while an active hub, or repeater, amplifies and refreshes the stream of data which otherwise would deteriorate over a distance. The term hub device, as used herein, refers to a hub chip that includes logic (hardware and/or software) for performing memory functions.

Also as used herein, the term "bus" refers to one of the sets of conductors (e.g., wires, and printed circuit board traces or connections in an integrated circuit) connecting two or more functional units in a computer. The data bus, address bus and control signals, despite their names, constitute a single bus since each are often useless without the others. A bus may include a plurality of signal lines, each signal line having two or more connection points, that form a main transmission path that electrically connects two or more transceivers, transmitters and/or receivers. The term "bus" is contrasted with the term "channel" which is often used to describe the function of a "port" as related to a memory controller in a memory system, and which may include one or more busses or sets of busses. The term "channel" as used herein refers to a port on a memory controller. Note that this term is often used in conjunction with I/O or other peripheral equipment, however the term channel has been adopted by some to describe the interface between a processor or memory controller and one of one or more memory subsystem(s).

Further, as used herein, the term "daisy chain" refers to a bus wiring structure in which, for example, device A is wired to device B, device B is wired to device C, etc. The last device is typically wired to a resistor or terminator. All devices may receive identical signals or, in contrast to a simple bus, each device may modify one or more signals before passing them on. A "cascade" or cascade interconnect' as used herein refers to a succession of stages or units or a collection of interconnected networking devices, typically hubs, in which the hubs operate as a logical repeater, further permitting merging data to be concentrated into the existing data stream. Also as used herein, the term "point-to-point" bus and/or link refers to one or a plurality of signal lines that may each include one or more terminators. In a point-to-point bus and/or link, each signal line has two transceiver connection points, with each transceiver connection point coupled to transmitter circuitry, receiver circuitry or transceiver circuitry. A signal line refers to one or more electrical conductors or optical carriers, generally configured as a single carrier or as two or more carriers, in a twisted, parallel, or concentric arrangement, used to transport at least one logical signal.

Memory devices are generally defined as integrated circuits that are composed primarily of memory (storage) cells, such as DRAMs (Dynamic Random Access Memories), SRAMs (Static Random Access Memories), FeRAMs (Ferro-Electric RAMs), MRAMs (Magnetic Random Access Memories), Flash Memory and other forms of random access and related memories that store information in the form of electrical, optical, magnetic, biological or other means. Dynamic memory device types may include asynchronous memory devices such as FPM DRAMs (Fast Page Mode Dynamic Random Access Memories), EDO (Extended Data Out) DRAMs, BEDO (Burst EDO) DRAMs, SDR (Single Data Rate) Synchronous DRAMs, DDR (Double Data Rate) Synchronous DRAMs or any of the expected follow-on devices such as DDR2, DDR3, DDR4 and related technologies such as Graphics RAMs, Video RAMs, LP RAM (Low Power DRAMs) which are often based on the fundamental functions, features and/or interfaces found on related DRAMs.

Memory devices may be utilized in the form of chips (die) and/or single or multi-chip packages of various types and configurations. In multi-chip packages, the memory devices may be packaged with other device types such as other memory devices, logic chips, analog devices and programmable devices, and may also include passive devices such as resistors, capacitors and inductors. These packages may include an integrated heat sink or other cooling enhancements, which may be further attached to the immediate carrier or another nearby carrier or heat removal system.

Module support devices (such as buffers, hubs, hub logic chips, registers, PLL's, DLL's, non-volatile memory, etc) may be comprised of multiple separate chips and/or components, may be combined as multiple separate chips onto one or more substrates, may be combined onto a single package or even integrated onto a single device—based on technology, power, space, cost and other tradeoffs. In addition, one or more of the various passive devices such as resistors, capacitors may be integrated into the support chip packages, or into the substrate, board or raw card itself, based on technology, power, space, cost and other tradeoffs. These packages may include an integrated heat sink or other cooling enhancements, which may be further attached to the immediate carrier or another nearby carrier or heat removal system.

Memory devices, hubs, buffers, registers, clock devices, passives and other memory support devices and/or components may be attached to the memory subsystem and/or hub device via various methods including solder interconnects, conductive adhesives, socket structures, pressure contacts and other methods which enable communication between the two or more devices via electrical, optical or alternate means.

The one or more memory modules (or memory subsystems) and/or hub devices may be electrically connected to the memory system, processor complex, computer system or other system environment via one or more methods such as soldered interconnects, connectors, pressure contacts, conductive adhesives, optical interconnects and other communication and power delivery methods. Connector systems may include mating connectors (male/female), conductive contacts and/or pins on one carrier mating with a male or female connector, optical connections, pressure contacts (often in conjunction with a retaining mechanism) and/or one or more of various other communication and power delivery methods. The interconnection(s) may be disposed along one or more edges of the memory assembly and/or placed a distance from an edge of the memory subsystem depending on such application requirements as ease-of-upgrade/repair, available space/volume, heat transfer, component size and shape and other related physical, electrical, optical, visual/physical access, etc. Electrical interconnections on a memory module are often referred to as contacts, or pins, or tabs. Electrical interconnections on a connector are often referred to as contacts or pins.

As used herein, the term memory subsystem refers to, but is not limited to: one or more memory devices; one or more memory devices and associated interface and/or timing/control circuitry; and/or one or more memory devices in conjunction with a memory buffer, hub device, and/or switch. The term memory subsystem may also refer to one or more memory devices, in addition to any associated interface and/or timing/control circuitry and/or a memory buffer, hub device or switch, assembled into a substrate, a card, a module or related assembly, which may also include a connector or similar means of electrically attaching the memory subsystem with other circuitry. The memory modules described herein may also be referred to as memory subsystems because they include one or more memory devices and hub devices Additional functions that may reside local to the memory subsystem and/or hub device include write and/or read buffers, one or more levels of memory cache, local pre-fetch logic, data encryption/decryption, compression/decompression, protocol translation, command prioritization logic, voltage and/or level translation, error detection and/or correction circuitry, data scrubbing, local power management circuitry and/or reporting, operational and/or status registers, initialization circuitry, performance monitoring and/or control, one or more co-processors, search engine(s) and other functions that may have previously resided in other memory subsystems. By placing a function local to the memory subsystem, added performance may be obtained as related to the specific function, often while making use of unused circuits within the subsystem.

Memory subsystem support device(s) may be directly attached to the same substrate or assembly onto which the memory device(s) are attached, or may be mounted to a separate interposer or substrate also produced using one or more of various plastic, silicon, ceramic or other materials which include electrical, optical or other communication paths to functionally interconnect the support device(s) to the memory device(s) and/or to other elements of the memory or computer system.

Information transfers (e.g. packets) along a bus, channel, link or other naming convention applied to an interconnection method may be completed using one or more of many signaling options. These signaling options may include such methods as single-ended, differential, optical or other approaches, with electrical signaling further including such methods as voltage or current signaling using either single or multi-level approaches. Signals may also be modulated using such methods as time or frequency, non-return to zero, phase shift keying, amplitude modulation and others. Voltage levels are expected to continue to decrease, with 1.5V, 1.2V, 1V and lower signal voltages expected consistent with (but often independent of) the reduced power supply voltages required for the operation of the associated integrated circuits themselves.

One or more clocking methods may be utilized within the memory subsystem and the memory system itself, including global clocking, source-synchronous clocking, encoded clocking or combinations of these and other methods. The clock signaling may be identical to that of the signal lines themselves, or may utilize one of the listed or alternate methods that is more conducive to the planned clock frequency (ies), and the number of clocks planned within the various subsystems. A single clock may be associated with all communication to and from the memory, as well as all clocked functions within the memory subsystem, or multiple clocks may be sourced using one or more methods such as those described earlier. When multiple clocks are used, the functions within the memory subsystem may be associated with a clock that is uniquely sourced to the subsystem, or may be based on a clock that is derived from the clock related to the information being transferred to and from the memory subsystem (such as that associated with an encoded clock). Alternately, a unique clock may be used for the information transferred to the memory subsystem, and a separate clock for information sourced from one (or more) of the memory subsystems. The clocks themselves may operate at the same or frequency multiple of the communication or functional frequency, and may be edge-aligned, center-aligned or placed in an alternate timing position relative to the data, command or address information.

Information passing to the memory subsystem(s) will generally be composed of address, command and data, as well as other signals generally associated with requesting or reporting status or error conditions, resetting the memory, completing memory or logic initialization and other functional, configuration or related information. Information passing from the memory subsystem(s) may include any or all of the information passing to the memory subsystem(s), however generally will not include address and command information. This information may be communicated using communication methods that may be consistent with normal memory device interface specifications (generally parallel in nature), the information may be encoded into a 'packet' structure, which may be consistent with future memory interfaces or simply developed to increase communication bandwidth and/or enable the subsystem to operate independently of the memory technology by converting the received information into the format required by the receiving device(s).

Initialization of the memory subsystem may be completed via one or more methods, based on the available interface busses, the desired initialization speed, available space, cost/complexity objectives, subsystem interconnect structures, the use of alternate processors (such as a service processor) which may be used for this and other purposes, etc. In one embodiment, the high speed bus may be used to complete the initialization of the memory subsystem(s), generally by first completing a training process to establish reliable communication, then by interrogation of the attribute or 'presence detect' data associated the various components and/or characteristics associated with that subsystem, and ultimately by programming the appropriate devices with information associated with the intended operation within that system. In a cascaded system, communication with the first memory subsystem would generally be established, followed by subsequent (downstream) subsystems in the sequence consistent with their position along the cascade interconnect bus.

A second initialization method would include one in which the high speed bus is operated at one frequency during the initialization process, then at a second (and generally higher) frequency during the normal operation. In this embodiment, it may be possible to initiate communication with all of the memory subsystems on the cascade interconnect bus prior to completing the interrogation and/or programming of each subsystem, due to the increased timing margins associated with the lower frequency operation.

A third initialization method might include operation of the cascade interconnect bus at the normal operational frequency (ies), while increasing the number of cycles associated with each address, command and/or data transfer. In one embodiment, a packet containing all or a portion of the address, command and/or data information might be transferred in one clock cycle during normal operation, but the same amount and/or type of information might be transferred over two, three or more cycles during initialization. This initialization process would therefore be using a form of 'slow' commands, rather than 'normal' commands, and this mode might be automatically entered at some point after power-up and/or re-start by each of the subsystems and the memory controller by way of POR (power-on-reset) logic included in each of these subsystems.

A fourth initialization method might utilize a distinct bus, such as a presence detect bus (such as the one defined in U.S. Pat. No. 5,513,135 to Dell et al., of common assignment herewith), an I2C bus (such as defined in published JEDEC standards such as the 168 Pin DIMM family in publication 21-C revision 7R8) and/or the SMBUS, which has been widely utilized and documented in computer systems using such memory modules. This bus might be connected to one or more modules within a memory system in a daisy chain/cascade interconnect, multi-drop or alternate structure, providing an independent means of interrogating memory subsystems, programming each of the one or more memory subsystems to operate within the overall system environment, and adjusting the operational characteristics at other times during the normal system operation based on performance, thermal, configuration or other changes desired or detected in the system environment.

Other methods for initialization can also be used, in conjunction with or independent of those listed. The use of a separate bus, such as described in the fourth embodiment above, also offers the advantage of providing an independent means for both initialization and uses other than initialization, such as described in U.S. Pat. No. 6,381,685 to Dell et al., of common assignment herewith, including changes to the subsystem operational characteristics on-the-fly and for the reporting of and response to operational subsystem information such as utilization, temperature data, failure information or other purposes.

With improvements in lithography, better process controls, the use of materials with lower resistance, increased field sizes and other semiconductor processing improvements, increased device circuit density (often in conjunction with increased die sizes) will help facilitate increased function on integrated devices as well as the integration of functions previously implemented on separate devices. This integration will serve to improve overall performance of the intended function, as well as promote increased storage density, reduced power, reduced space requirements, lower cost and other manufacturer and customer benefits. This integration is a natural evolutionary process, and may result in the need for structural changes to the fundamental building blocks associated with systems.

The integrity of the communication path, the data storage contents and all functional operations associated with each element of a memory system or subsystem can be assured, to a high degree, with the use of one or more fault detection and/or correction methods. Any or all of the various elements may include error detection and/or correction methods such as CRC (Cyclic Redundancy Code), EDC (Error Detection and Correction), parity or other encoding/decoding methods suited for this purpose. Further reliability enhancements may include operation re-try (to overcome intermittent faults such as those associated with the transfer of information), the use of one or more alternate or replacement communication paths to replace failing paths and/or lines, complement-re-complement techniques or alternate methods used in computer, communication and related systems.

The use of bus termination, on busses as simple as point-to-point links or as complex as multi-drop structures, is becoming more common consistent with increased performance demands. A wide variety of termination methods can be identified and/or considered, and include the use of such devices as resistors, capacitors, inductors or any combination thereof, with these devices connected between the signal line and a power supply voltage or ground, a termination voltage or another signal. The termination device(s) may be part of a passive or active termination structure, and may reside in one or more positions along one or more of the signal lines, and/or as part of the transmitter and/or receiving device(s). The terminator may be selected to match the impedance of the transmission line, or selected via an alternate approach to maximize the useable frequency, operating margins and related attributes within the cost, space, power and other constraints.

Technical effects and benefits include eliminating both the switching and leakage power associated with idle logic in order to reduce power consumption on a memory interface device.

As described above, the embodiments of the invention may be embodied in the form of computer-implemented processes and apparatuses for practicing those processes. Embodiments of the invention may also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

The invention claimed is:

1. A device for providing voltage power gating, the device comprising:
   a voltage island comprising:
      logic circuitry;
      a mechanism for receiving a control signal associated with the logic circuitry, the control signal indicating an active state or an idle state of the logic circuitry; and
      a selector for enabling a power source to the logic circuitry in response to the control signal indicating the active state and for disabling the power source to the logic circuitry in response to the control signal indicating the idle state;
   voltage island state logic for storing state information associated with the logic circuitry, the state information utilized during a repowering of the logic circuitry to ensure that the logic circuitry starts from a known state; and
   voltage island control logic for maintaining a stable output state from the logic circuitry when the power source to the logic circuitry is disabled;
   thereby dynamically eliminating the power source from the logic circuitry on the device when the logic circuitry is in the idle state.

2. The device of claim 1 wherein the control signal further indicates a voltage level for the active state and the power source is enabled at the indicated voltage level.

3. The device of claim 1 wherein the mechanism receives the control signal via a dedicated input/output (I/O) pin.

4. The device of claim 1 wherein the device is a memory interface device (MID) that is in communication with one or more memory devices and the mechanism receives the control signal via a command stream that is also utilized to communicate with the memory devices.

5. The device of claim 1 wherein the logic circuitry is enabled during system test and debug, and disabled during system mainline operation.

6. The device of claim 1 further comprising one or more additional voltage islands.

7. The device of claim 1 wherein the logic circuitry includes island logic that receives functional inputs and generates functional outputs.

8. A memory system comprising:
   a memory controller for generating commands;
   a high speed bus in communication with the memory controller; and
   a MID cascade interconnected with the memory controller via the high speed bus and in communication with one or more memory devices, the MID comprising:
      a voltage island comprising:
         logic circuitry for performing all or a subset of the commands;
         a mechanism for receiving a control signal associated with the logic circuitry, the control signal indicating an active state or an idle state; and
         a selector for enabling a power source to the logic circuitry in response to the control signal indicating the active state and for disabling the power source to the logic circuitry in response to the control signal indicating the idle state;
      voltage island state logic for storing state information associated with the logic circuitry, the state information utilized during a repowering of the logic circuitry to ensure that the logic circuitry starts from a known state; and
      voltage island control logic for maintaining a stable output state from the logic circuitry when the power source to the logic circuitry is disabled;
      thereby dynamically eliminating the power source from the logic circuitry on the MID when the logic circuitry is in the idle state.

9. The memory system of claim 8 wherein the control signal further indicates a voltage level for the active state and the power source is enabled at the indicated voltage level.

10. The memory system of claim 8 wherein the MID further comprises one or more additional voltage islands.

11. The memory system of claim 8 wherein the mechanism receives the control signal via a dedicated I/O pin.

12. The memory system of claim 8 wherein the control signal is received from the memory controller via a command.

13. The memory system of claim 8, wherein the MID further comprises a service interface and the control signal is received via the service interface.

14. A method for providing voltage power gating on a device, the method comprising:
   receiving a control signal associated with logic circuitry on a voltage island (VI) located on a device, the control signal indicating an active state;
   supplying a power source to the VI in response to the control signal;
   removing a fencing signal to allow the VI to interface with device logic external to the VI;
   loading a previous state of the logic circuitry in response to removing the fencing executing all or a portion of the logic circuitry located on the VI in response to loading the previous state of the VI;
   enabling the fencing signal, wherein the fencing signal is utilized to maintain a stable output from the logic circuitry when the logic circuitry is disabled; and
   disabling the power source to the VI.

15. The method of claim 14 further comprising saving a current state of the VI in response to the executing.

16. The method of claim 14 further comprising powering-on and initializing the device prior to the receiving.

17. The method of claim 14 wherein the device is a MID.

* * * * *